US012695446B2

(12) United States Patent
Guo et al.

(10) Patent No.: US 12,695,446 B2
(45) Date of Patent: Jul. 28, 2026

(54) BLANKING-TIME-LESS DESATURATION PROTECTION METHOD FOR POWER DEVICES

(71) Applicant: The Florida State University Research Foundation, Inc., Tallahassee, FL (US)

(72) Inventors: Zhehui Guo, Tallahassee, FL (US); Hui Li, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 87 days.

(21) Appl. No.: 18/590,343

(22) Filed: Feb. 28, 2024

(65) Prior Publication Data

US 2024/0291476 A1 Aug. 29, 2024

Related U.S. Application Data

(60) Provisional application No. 63/448,860, filed on Feb. 28, 2023.

(51) Int. Cl.
H03K 17/0812 (2006.01)

(52) U.S. Cl.
CPC .............................. H03K 17/0812 (2013.01)

(58) Field of Classification Search
CPC ................................................. H03K 17/0812
USPC .......................................................... 361/18
See application file for complete search history.

(56) References Cited

U.S. PATENT DOCUMENTS

| | | | |
|---|---|---|---|
| 8,885,310 B2 | 11/2014 | Kandah | |
| 2021/0098982 A1* | 4/2021 | Li | ........................... G01R 31/52 |
| 2021/0351770 A1 | 11/2021 | Liu et al. | |

FOREIGN PATENT DOCUMENTS

| | | | | |
|---|---|---|---|---|
| CN | 110838787 B | * | 8/2020 | ........... H03K 17/687 |
| WO | WO-2021040153 A1 | * | 3/2021 | ......... H03K 17/0828 |
| WO | WO-2022088010 A1 | * | 5/2022 | ............ H02M 1/083 |

OTHER PUBLICATIONS

B. Hu, X. Lyu, D. Xing, D. Ma, J. Brothers, R. Na and J. Wang, "A survey on recent advances of MV silicon carbide power devices," in Proc. IEEE Energy Convers. Congr. Expo., 2018, pp. 2420-2427.
P. D. Reigosa, H. Luo and F. Iannuzzo, "Implications of ageing Through power cycling on the short-circuit robustness of 1.2-kV SiC MOSFETs," IEEE Trans. Power Electron., vol. 34, No. 11, pp. 11182-11190, Nov. 2019.
A. Tripathi, K. Mainali, S. Madhusoodhanan, A. Yadav, K. Vechalapu and S. Bhattacharya, "A MV intelligent gate driver for 15-kV SiC IGBT and 10-KV SiC MOSFET," in Proc. IEEE Appl. Power Electron. Conf., 2016, pp. 2076-2082.

(Continued)

*Primary Examiner* — Sreeya Sreevatsa
(74) *Attorney, Agent, or Firm* — Meunier Carlin & Curfman LLC

(57) ABSTRACT

The disclosure relates to a devices, systems and methods implementing desaturation protection during faults (over-current or short-circuit faults) for a power device by monitoring drain source voltage and rate of change of the drain source voltage which provides a fault response time ($t_0$ to $t_2$) that is shorter than the blanking time ($t_0$ to $t_5$) required by conventional desaturation protection methods.

3 Claims, 4 Drawing Sheets

Desaturation protection circuit

(56) References Cited

OTHER PUBLICATIONS

Y. Cui, Z. Zhang, P. Yi and L. Wei, "Investigation of current mirror based overcurrent protection for 1200-V/800-A high power SiC MOSFET modules," in Proc. IEEE Energy Convers. Congr. Expo., 2019, pp. 6161-6165.

D. Rothmund, D. Bortis and J. W. Kolar, "Highly compact isolated gate driver with ultrafast overcurrent protection for 10-KV SiC MOSFETs," CPSS Trans. Power Electron. Appl., vol. 3, No. 4, pp. 278-291, Dec. 2018.

J. Wang, S. Mocevic, R. Burgos and D. Boroyevich, "High-scalability enhanced gate drivers for SiC MOSFET modules with transient immunity beyond 100 V/ns, " IEEE Trans. Power Electron., vol. 35, No. 10, pp. 10180-10199, Oct. 2020.

Z. Wang, X. Shi, Y. Xue, L. M. Tolbert, F. Wang and B. J. Blalock, "Design and performance evaluation of overcurrent protection schemes for silicon carbide (SiC) power MOSFETs," IEEE Trans. Ind. Electron. vol. 61, No. 10, pp. 5570-5581, Oct. 2014.

X. Huang et al., "Comprehensive analysis and improvement methods of noise immunity of desat protection for high voltage SiC MOSFETs with high dv/dt," IEEE Open J. Power Electron., vol. 3, pp. 36-50, 2022.

X. Lyu et al., "A reliable ultrafast short-circuit protection method for E-mode GaN Hemt," IEEE Trans. Power Electron., vol. 35, No. 9, pp. 8926-8933, Sep. 2020.

* cited by examiner

BLANKING-TIME-LESS DESATURATION PROTECTION METHOD FOR POWER DEVICES

CROSS REFERENCE TO RELATED APPLICATION

This application claims priority to and benefit of U.S. provisional patent application Ser. No. 63/448,860 filed Feb. 28, 2023, which is fully incorporated by reference and made a part hereof.

I. STATEMENT OF GOVERNMENT SUPPORT

This invention was made with Government support under N00014-16-1-2956 and N00014-21-1-2124 awarded by the Office of Naval Research. The Government has certain rights in the invention.

BACKGROUND

Electrical switching devices, such as transistors, generally require an input current or voltage to switch the state of the switching device. The switching current or voltage may be greater than the current or voltage that the circuit controlling the switching device can produce. This is common in applications where the controller is a microcontroller or other integrated circuit, and the switching device is a high-power device such as a power MOSFET (metal-oxide-semiconductor field effect transistor). Gate driver circuits are used to amplify the output current or voltage of the control circuit to produce a current and/or voltage large enough to switch the state of the switching device.

SiC MOSFETs (metal-oxide-semiconductor field effect transistors) have gained popularity in high-frequency and high-power applications due to the faster switching speed, lower conduction loss and higher temperature endurability. However, SiC MOSFETs have a smaller die area and a higher short-circuit (SC) current than Si-based counterparts, so they have a less SC withstand time and degrade faster under the repetitive SC faults. Therefore, a SC protection (SCP) with fast response time is required for SiC MOSFETs. Meanwhile, the expected SCP should have a robust noise immunity to the high dv/dt of SiC MOSFETs, especially for medium voltage (MV) SiC MOSFETs.

Different types of SCP methods have been developed for SiC MOSFETs. The shunt resistor for this purpose is built inside device package, but extra loss is induced especially for high current application. Instead, current mirror technology (also named SenseFET) reduces sensing current with a current mirror ratio of 100:1~1000:1, whereas the complexity and cost of device production increase. The current transformer is an alternative solution for the lossless current sensing, but it increases power loop path and requires a dedicated insulation design in MV applications. The di/dt of device current can be sensed to reestablish the fault current shape, either by using Rogowski coil, or by sensing the voltage across source terminal stray inductance. However, the former one requires a case-by-case designed Rogowski coil that needs extra space, while the latter one requires the accessible stray inductance determined by device packages.

Desaturation protection detects drain-source voltage $v_{ds}$ of SiC MOSFET to monitor both SC fault at hard-switching-fault (HSF) condition and over-current (OC) fault at fault-under-load (FUL) condition. Due to the low cost and easy-to-integration, desaturation protection is still widely adopted for SiC MOSFETs. Desaturation protection requires an adequate blanking time to screen turn-on switching noises, so that its SC fault response time must be longer than the normal turn-on transient time. Nonetheless, extra filters are usually needed to improve the noise immunity, which further slows the SC fault response speed. The dc-link voltage dip occurring at HSF condition is utilized to achieve an ultra-fast SC fault detection. However, this method still depends on desaturation protection to avoid false triggering and to localize the fault switch. In addition, for medium voltage (MV) applications, this method requires special layout design to sense dc-link voltage.

Conventional desaturation protection method only detect $v_{ds}$ of power devices to trigger the protection once $v_{ds}$ exceeds a threshold. The desaturation protection scheme shown as FIG. 1A has been widely adopted in commercial gate driver ICs.

FIGS. 1B and 1C show the desaturation protection operation waveforms during the normal turn-on transient and SC fault, respectively, of FIG. 1A. As shown in FIG. 1B, during the normal turn-on transient, a blanking time (i.e., $t_0\sim t_5$) longer than turn-on transient time (i.e., $t_0\sim t_4$) is required to screen the switching noise to avoid the false triggering of desaturation protection. A longer blanking time is usually required to further mitigate the false triggering issue. As shown in FIG. 1C; however, during the SC fault, the longer blanking time results in a slower SC fault response time and a worse fault energy stress on the power device.

However, all the existing desaturation protection methods have the following limitations: (1) The fault response time of existing desaturation protection cannot be shorter than the blanking time (i.e., normal turn-on transient time of power device); and (2) The existing desaturation protection method has a trade-off between the fault response time and noise immunity.

Therefore, what is needed are devices, methods, and systems overcome challenges in the art, some of which are described above. In particular, devices, methods, and systems implementing a blanking-time-less desaturation protection for power devices are desired.

SUMMARY

Disclosed and described herein are embodiments of devices, methods, and systems for implementing a blanking-time-less desaturation protection method for power devices, by which the fault response time is shorter than the blanking time required by conventional desaturation protection methods.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The accompanying drawings, which are incorporated in and constitute a part of this specification, illustrate embodiments and together with the description, serve to explain the principles of the disclosed technology.

DETAILED DESCRIPTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1A:
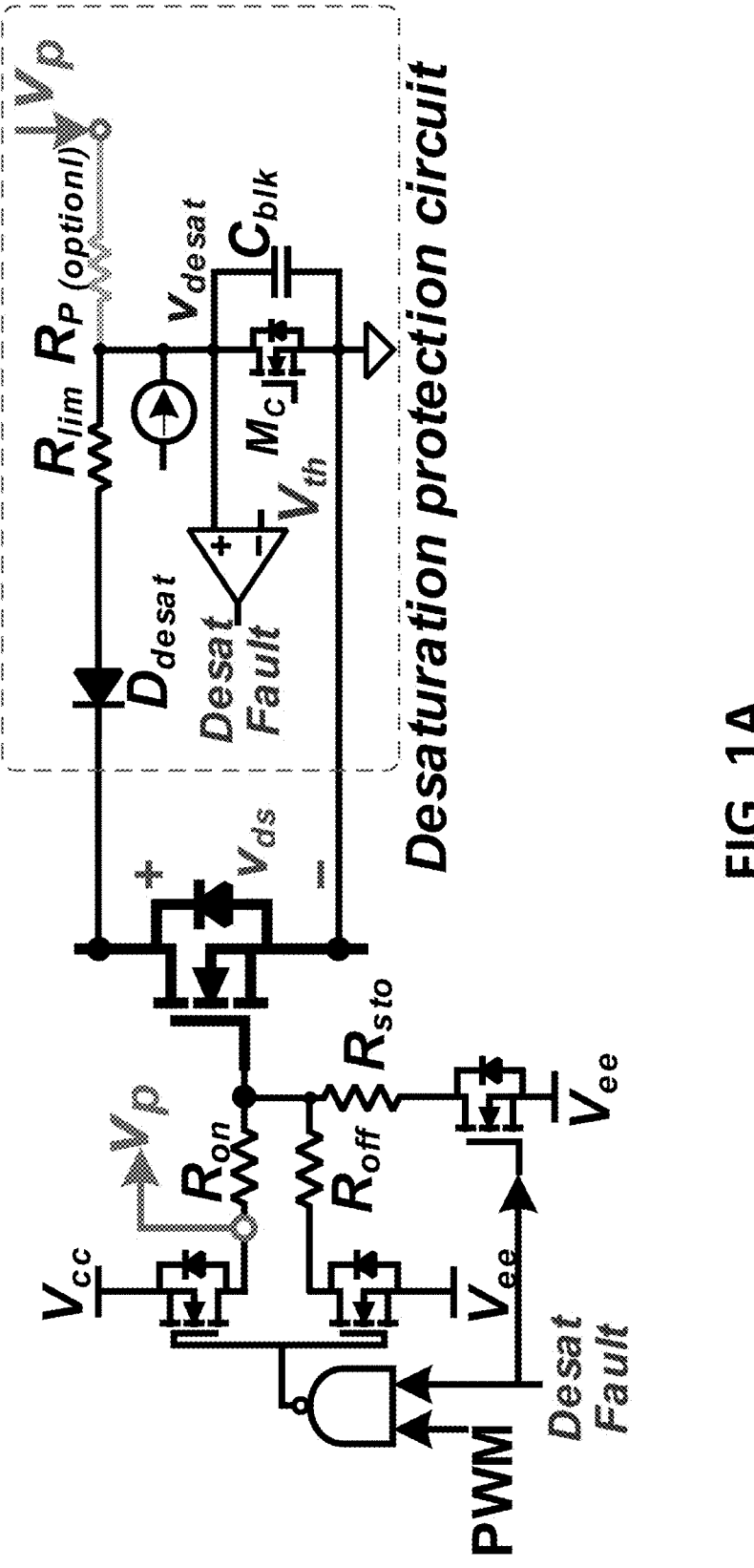
FIG. 1A is a schematic of a conventional desaturation protection circuit.
Figure 1C:
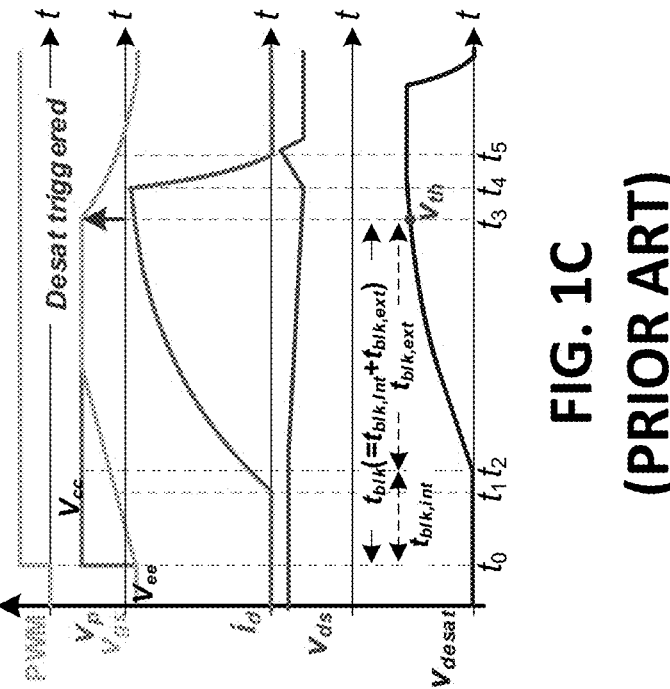
FIG. 1C illustrates exemplary waveforms of the circuit of FIG. 1A during short-circuit conditions.
Figure 1B:
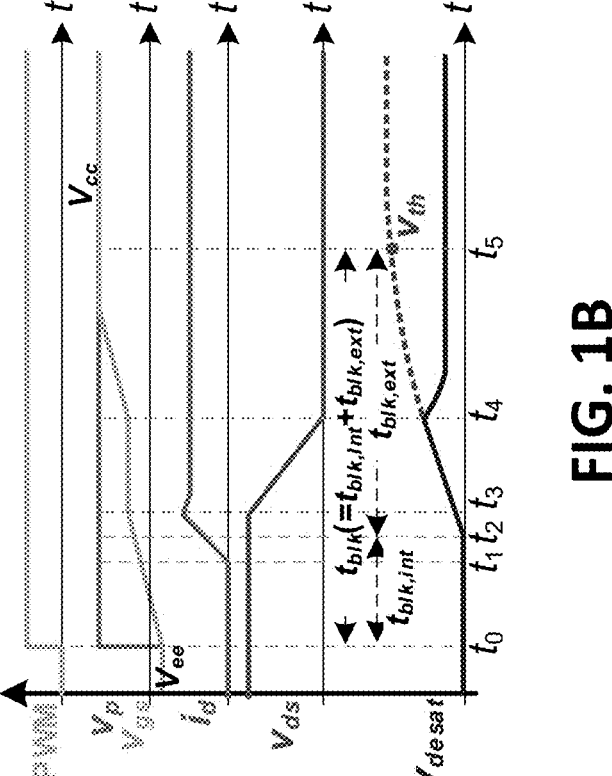
FIG. 1B illustrates exemplary waveforms of the circuit of FIG. 1A during normal conditions.
Figure 2A:
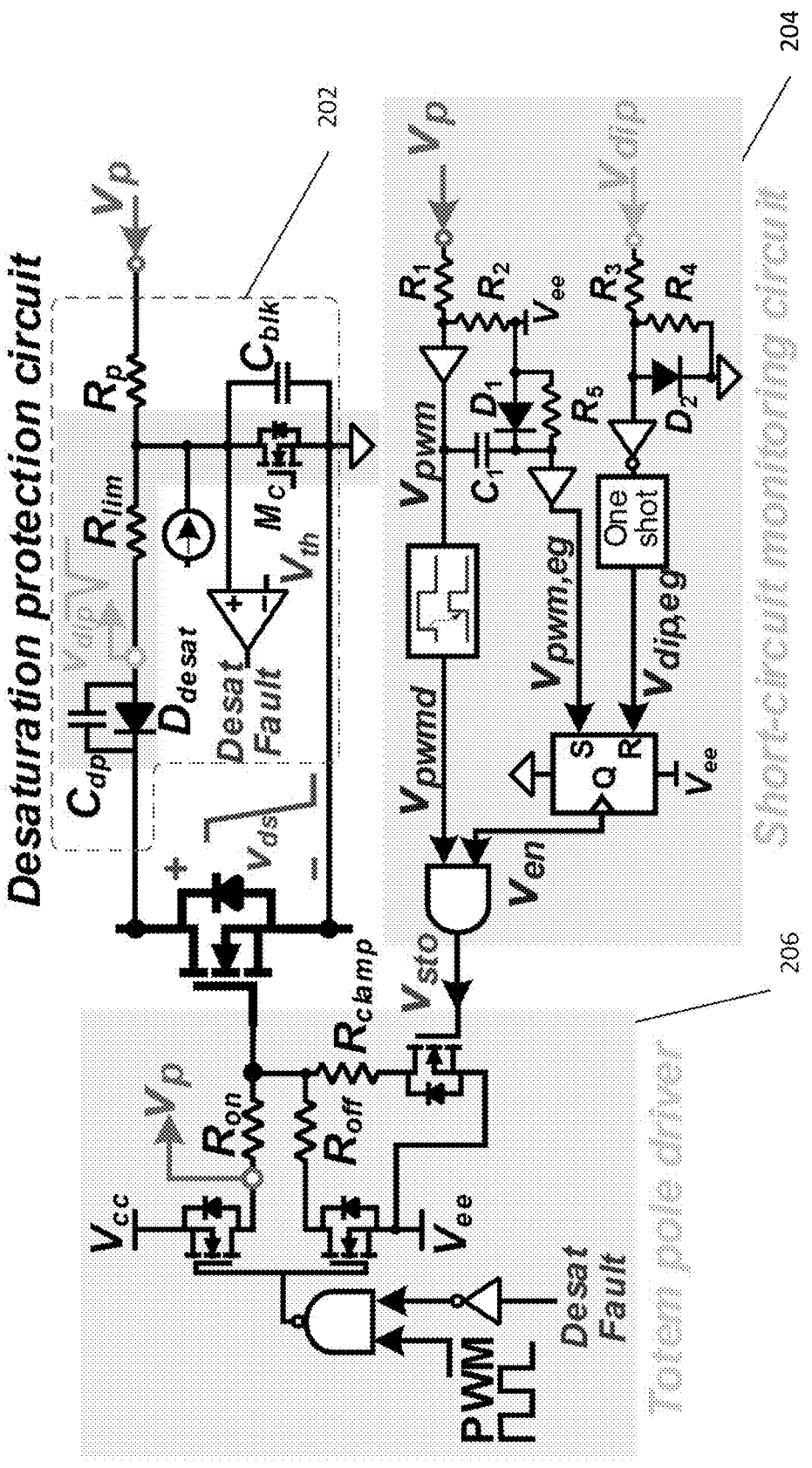
FIG. 2A is an illustration of an implementation of a circuit that includes an embodiment of a blanking-time-less desaturation method for power devices.
Figure 2B:
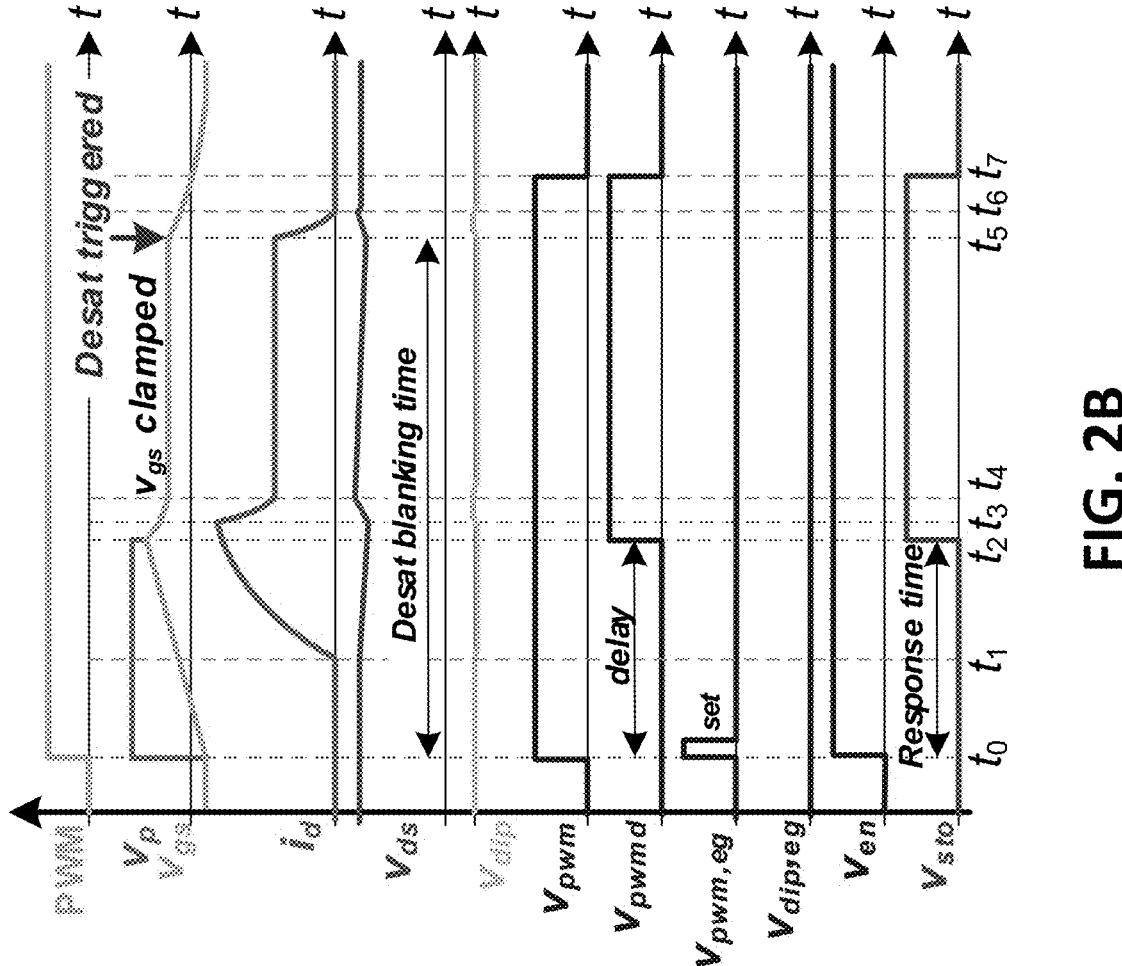
FIG. 2B illustrates the operation waveforms of various components of the circuit shown in FIG. 2A during a short-circuit (SC) fault.

FIG. 2A is a schematic of an implementation of a circuit that includes an embodiment of a blanking-time-less desaturation method for power devices. FIG. 2B illustrates the operation waveforms of various components of the circuit shown in FIG. 2A during a short-circuit (SC) fault. As can be seen in FIG. 2B, the fault response time ($t_0$ to $t_2$) is shorter than the blanking time ($t_0$ to $t_5$ shown in FIG. 1B-C) required by conventional desaturation protection methods. The circuit implementation shown in FIG. 2A is comprised of three subcircuits: (202) a desaturation protection circuit (shown within dashed lines in FIG. 2A); (204) a SC monitoring circuit; and (206) a totem-pole driver.

The disclosed method detects both the drain-source voltage, $V_{ds}$, of a power device, as well as the dv/dt of the $V_{ds}$ to monitor over-current (OC) and SC faults of the exemplary power device. During an OC fault, the disclosed method depends on the $V_{ds}$ detection (by desaturation protection circuit) to monitor the OC fault. The operation principle of the disclosed method during a SC fault is shown in FIG. 2B. The SC fault is firstly monitored by the SC monitoring circuit 204 at $t_2$ since NO falling dv/dt of $V_{ds}$ is sensed, and then monitored by the desaturation protection circuit 202 at $t_5$. Once the SC fault is monitored at $t_2$, the active gate clamping is activated to mitigate the SC current until the desaturation protection is triggered at $t_5$, after which the power device is fully turned off. Note that the SC fault response time (i.e., $t_0 \sim t_2$) of disclosed method is set by the dv/dt detection timer (i.e., time delay between the signal $V_{pwm}$ and $V_{pwmd}$) of SC monitoring circuit, and it is much shorter than the blanking time required by existing desaturation protection methods.

Advantageously, the disclosed method utilizes both voltage and rate of change in voltage (dv/dt) to monitor faults of a power device, which breaks the blanking time limitation of existing desaturation protection method and thus achieves a faster fault response time. Further, the disclosed method has an enhanced noise immunity to the switching noises of power devices, especially for wide-bandgap (WBG) power devices such as SiC and GaN devices.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A circuit that provides blanking-time-less desaturation protection for a power device during a fault, comprising:

a desaturation protection sub-circuit;

a fault monitoring sub-circuit; and a totem-pole driver sub-circuit, wherein a drain-source voltage, $V_{ds}$, and a rate of change of the drain-source voltage, dv/dt, of the power device are monitored during the fault, wherein the fault comprises a short-circuit (SC) fault and the SC fault is first monitored by the fault monitoring circuit at a time, t2, by sensing fall in dv/dt of Vds, wherein t2 is shorter than the blanking time t5, and then monitored by the desaturation protection circuit at time t5, and wherein once the SC fault is monitored at time t2 by the fault monitoring circuit, active gate clamping is activated by the totem-pole driver sub-circuit to mitigate a SC current until desaturation protection is triggered at time t5, after which the power device is fully turned off, wherein the circuit provides a fault response time (t0 to t2) that is shorter than a blanking time (t0 to t5) required by conventional desaturation protection methods.

2. The circuit of claim 1, wherein the fault comprises an over-current (OC) fault and detection of $V_{ds}$ by the desaturation protection sub-circuit is used to monitor the OC fault.

3. The system of claim 1, wherein the power device comprises a Si, SiC, or GaN power device.

\* \* \* \* \*